(12) United States Patent
King et al.

(10) Patent No.: US 7,938,079 B2
(45) Date of Patent: *May 10, 2011

(54) ANNULAR AEROSOL JET DEPOSITION USING AN EXTENDED NOZZLE

(75) Inventors: Bruce H. King, Albuquerque, NM (US); Michael J. Renn, Hudson, WI (US); Marcelino Essien, Cedar Crest, NM (US); Gregory J. Marquez, Albuquerque, NM (US); Manampathy G. Giridharan, Mason, OH (US); Jyh-Cherng Sheu, Hsinchu (TW)

(73) Assignee: Optomec Design Company, Albuquerque, NM (US)

(*) Notice: Subject to any disclaimer, the term of this patent is extended or adjusted under 35 U.S.C. 154(b) by 1287 days.

This patent is subject to a terminal disclaimer.

(21) Appl. No.: 11/011,366

(22) Filed: Dec. 13, 2004

(65) Prior Publication Data

US 2006/0008590 A1 Jan. 12, 2006

Related U.S. Application Data

(60) Continuation-in-part of application No. 10/952,108, filed on Sep. 27, 2004, now Pat. No. 7,294,366, which is a continuation-in-part of application No. 10/746,646, filed on Dec. 23, 2003, now abandoned, which is a continuation-in-part of application No. 09/844,666, filed on Apr. 27, 2001, now abandoned, (Continued)

(51) Int. Cl.
*B05C 5/00* (2006.01)
*B05C 19/00* (2006.01)
*F23D 11/10* (2006.01)

(52) U.S. Cl. ......... 118/300; 118/308; 239/418; 239/601

(58) Field of Classification Search .............. 118/300, 118/308, 309, 326; 427/596, 446, 455, 591, 427/180; 385/125, 11, 147; 435/438; 239/102.1, 239/135, 299, 690, 692, 704–708, 290, 291, 239/398, 417.5, 419.5, 418, 422, 297, 601; 250/251, 288

See application file for complete search history.

(56) References Cited

U.S. PATENT DOCUMENTS 3,474,971 A 10/1969 Goodrich
(Continued)

FOREIGN PATENT DOCUMENTS

EP 0 331 022 A2 9/1989
(Continued)

OTHER PUBLICATIONS

Fernandez De La Mora, J. et al., "Aerodynamic focusing of particles in a carrier gas", *J. Fluid Mech.* vol. 195, printed in Great Britain 1988, 1-21.

(Continued)

*Primary Examiner* — Yewebdar T Tadesse
(74) *Attorney, Agent, or Firm* — Philip D. Askenazy; Stephen A. Slusher; Peacock Myers, P.C.

(57) ABSTRACT

Method and apparatus for improved maskless deposition of electronic and biological materials using an extended nozzle. The process is capable of direct deposition of features with linewidths varying from a few microns to a fraction of a millimeter, and can be used to deposit features on targets with damage thresholds near 100° C. or less. Deposition and subsequent processing may be performed under ambient conditions and produce linewidths as low as 1 micron, with submicron edge definition. The extended nozzle reduces particle overspray and has a large working distance; that is, the orifice to target distance may be several millimeters or more, enabling direct write onto non-planar surfaces. The nozzle allows for deposition of features with linewidths that are approximately as small as one-twentieth the size of the nozzle orifice diameter, and is preferably interchangeable, enabling rapid variance of deposited linewidth.

18 Claims, 5 Drawing Sheets

Related U.S. Application Data which is a division of application No. 09/305,985, filed on May 5, 1999, now Pat. No. 6,251,488, said application No. 10/746,646 is a continuation-in-part of application No. 10/346,935, filed on Jan. 17, 2003, now Pat. No. 7,045,015, which is a continuation of application No. 09/408,621, filed on Sep. 30, 1999, now abandoned, said application No. 10/346,935 is a continuation-in-part of application No. 09/584,997, filed on Jun. 1, 2000, now Pat. No. 6,636,676, which is a continuation-in-part of application No. 09/408,621, filed on Sep. 30, 1999, now abandoned, said application No. 10/346,935 is a continuation-in-part of application No. 10/072,605, filed on Feb. 5, 2002, now Pat. No. 7,108,894, which is a continuation-in-part of application No. 10/060,960, filed on Jan. 30, 2002, now abandoned, which is a continuation-in-part of application No. 09/408,621, filed on Sep. 30, 1999, now abandoned.

(60) Provisional application No. 60/508,759, filed on Oct. 3, 2003, provisional application No. 60/506,495, filed on Sep. 26, 2003, provisional application No. 60/102,418, filed on Sep. 30, 1998.

U.S. PATENT DOCUMENTS

| Patent No. | | Date | Inventor |
|---|---|---|---|
| 3,590,477 | A | 7/1971 | Cheroff et al. |
| 3,715,785 | A | 2/1973 | Brown et al. |
| 3,808,432 | A | 4/1974 | Ashkin |
| 3,808,550 | A | 4/1974 | Ashkin |
| 3,846,661 | A | 11/1974 | Brown et al. |
| 3,854,321 | A | 12/1974 | Dahneke |
| 3,901,798 | A | 8/1975 | Peterson |
| 3,959,798 | A | 5/1976 | Hochberg et al. |
| 3,974,769 | A | 8/1976 | Hochberg et al. |
| 3,982,251 | A | 9/1976 | Hochberg |
| 4,016,417 | A | 4/1977 | Benton |
| 4,019,188 | A | 4/1977 | Hochberg et al. |
| 4,034,025 | A | 7/1977 | Martner |
| 4,046,073 | A | 9/1977 | Mitchell et al. |
| 4,046,074 | A | 9/1977 | Hochberg et al. |
| 4,092,535 | A | 5/1978 | Ashkin et al. |
| 4,112,437 | A | 9/1978 | Mir et al. |
| 4,132,894 | A | 1/1979 | Yule |
| 4,171,096 | A | 10/1979 | Welsh et al. |
| 4,200,660 | A | 4/1980 | Schaefer et al. |
| 4,228,440 | A | 10/1980 | Horike et al. |
| 4,269,868 | A | 5/1981 | Livsey |
| 4,323,756 | A | 4/1982 | Brown et al. |
| 4,453,803 | A | 6/1984 | Hidaka et al. |
| 4,485,387 | A | 11/1984 | Drumheller |
| 4,497,692 | A | 2/1985 | Gelchinski et al. |
| 4,601,921 | A | 7/1986 | Lee |
| 4,605,574 | A | 8/1986 | Yonehara et al. |
| 4,670,135 | A | 6/1987 | Marple et al. |
| 4,689,052 | A | 8/1987 | Ogren et al. |
| 4,825,299 | A | 4/1989 | Okada et al. |
| 4,826,583 | A | 5/1989 | Biernaux et al. |
| 4,893,886 | A | 1/1990 | Ashkin et al. |
| 4,904,621 | A | 2/1990 | Loewenstein et al. |
| 4,911,365 | A | 3/1990 | Thiel et al. |
| 4,947,463 | A | 8/1990 | Matsuda et al. |
| 4,997,809 | A | 3/1991 | Gupta |
| 5,032,850 | A | 7/1991 | Andeen et al. |
| 5,043,548 | A | 8/1991 | Whitney et al. |
| 5,164,535 | A | 11/1992 | Leasure |
| 5,170,890 | A | 12/1992 | Wilson et al. |
| 5,176,744 | A | 1/1993 | Muller |
| 5,182,430 | A | 1/1993 | Lagain |
| 5,194,297 | A | 3/1993 | Scheer et al. |
| 5,208,431 | A | 5/1993 | Uchiyama et al. |
| 5,250,383 | A * | 10/1993 | Naruse ........................ 430/131 |
| 5,254,832 | A | 10/1993 | Gartner et al. |
| 5,270,542 | A | 12/1993 | McMurry et al. |
| 5,292,418 | A | 3/1994 | Morita et al. |
| 5,322,221 | A | 6/1994 | Anderson |
| 5,335,000 | A | 8/1994 | Stevens |
| 5,344,676 | A | 9/1994 | Kim et al. |
| 5,366,559 | A | 11/1994 | Periasamy |
| 5,378,505 | A | 1/1995 | Kubota et al. |
| 5,378,508 | A | 1/1995 | Castro et al. |
| 5,403,617 | A | 4/1995 | Haaland |
| 5,449,536 | A | 9/1995 | Funkhouser |
| 5,486,676 | A | 1/1996 | Aleshin |
| 5,495,105 | A | 2/1996 | Nishimura et al. |
| 5,512,745 | A | 4/1996 | Finer et al. |
| 5,607,730 | A | 3/1997 | Ranalli |
| 5,609,921 | A | 3/1997 | Gitzhofer et al. |
| 5,612,099 | A | 3/1997 | Thaler |
| 5,614,252 | A | 3/1997 | McMillan et al. |
| 5,648,127 | A | 7/1997 | Turchan et al. |
| 5,676,719 | A * | 10/1997 | Stavropoulos et al. ......... 55/466 |
| 5,733,609 | A | 3/1998 | Wang |
| 5,736,195 | A | 4/1998 | Haaland |
| 5,742,050 | A * | 4/1998 | Amirav et al. ................ 250/288 |
| 5,770,272 | A | 6/1998 | Biemann et al. |
| 5,772,106 | A | 6/1998 | Ayers et al. |
| 5,814,152 | A | 9/1998 | Thaler |
| 5,844,192 | A | 12/1998 | Wright et al. |
| 5,854,311 | A | 12/1998 | Richart |
| 5,861,136 | A | 1/1999 | Glicksman et al. |
| 5,940,099 | A | 8/1999 | Karlinski |
| 5,958,268 | A | 9/1999 | Engelsberg et al. |
| 5,965,212 | A | 10/1999 | Dobson et al. |
| 5,980,998 | A | 11/1999 | Sharma et al. |
| 5,993,549 | A | 11/1999 | Kindler et al. |
| 5,997,956 | A | 12/1999 | Hunt et al. |
| 6,007,631 | A | 12/1999 | Prentice et al. |
| 6,015,083 | A | 1/2000 | Hayes et al. |
| 6,025,037 | A | 2/2000 | Wadman et al. |
| 6,110,144 | A | 8/2000 | Choh et al. |
| 6,116,718 | A | 9/2000 | Peeters et al. |
| 6,136,442 | A | 10/2000 | Wong |
| 6,151,435 | A | 11/2000 | Pilloff |
| 6,159,749 | A | 12/2000 | Liu |
| 6,182,688 | B1 | 2/2001 | Fabre |
| 6,251,488 | B1 | 6/2001 | Miller et al. |
| 6,258,733 | B1 | 7/2001 | Solayappan et al. |
| 6,265,050 | B1 | 7/2001 | Wong et al. |
| 6,267,301 | B1 | 7/2001 | Haruch |
| 6,290,342 | B1 | 9/2001 | Vo et al. |
| 6,291,088 | B1 | 9/2001 | Wong et al. |
| 6,293,659 | B1 | 9/2001 | Floyd et al. |
| 6,340,216 | B1 | 1/2002 | Peeters et al. |
| 6,348,687 | B1 | 2/2002 | Brockmann et al. |
| 6,349,668 | B1 | 2/2002 | Sun et al. |
| 6,384,365 | B1 | 5/2002 | Seth et al. |
| 6,390,115 | B1 | 5/2002 | Rohwer et al. |
| 6,406,137 | B1 | 6/2002 | Okazaki et al. |
| 6,416,156 | B1 | 7/2002 | Noolandi et al. |
| 6,416,157 | B1 | 7/2002 | Peeters et al. |
| 6,416,158 | B1 | 7/2002 | Floyd et al. |
| 6,416,159 | B1 | 7/2002 | Floyd et al. |
| 6,454,384 | B1 | 9/2002 | Peeters et al. |
| 6,467,862 | B1 | 10/2002 | Peeters et al. |
| 6,471,327 | B2 | 10/2002 | Jagannathan et al. |
| 6,481,074 | B1 | 11/2002 | Karlinski |
| 6,503,831 | B2 | 1/2003 | Speakman |
| 6,513,736 | B1 | 2/2003 | Skeath et al. |
| 6,521,297 | B2 | 2/2003 | McDougall et al. |
| 6,537,501 | B1 | 3/2003 | Holl et al. |
| 6,544,599 | B1 | 4/2003 | Brown et al. |
| 6,548,122 | B1 | 4/2003 | Sharma et al. |
| 6,573,491 | B1 | 6/2003 | Marchitto et al. |
| 6,607,597 | B2 | 8/2003 | James et al. |
| 6,636,676 | B1 | 10/2003 | Renn |
| 6,646,253 | B1 * | 11/2003 | Rohwer et al. ................ 250/288 |
| 6,772,649 | B2 * | 8/2004 | Zimmermann et al. ... 73/863.11 |
| 6,780,377 | B2 | 8/2004 | Hall et al. |
| 6,811,805 | B2 | 11/2004 | Gilliard et al. |
| 6,823,124 | B1 | 11/2004 | Renn et al. |
| 6,832,124 | B2 | 12/2004 | Renn et al. |

| | | | |
|---|---|---|---|
| 6,890,624 B1 | 5/2005 | Kambe et al. | |
| 6,998,785 B1 | 2/2006 | Silfvast et al. | |
| 7,108,894 B2 * | 9/2006 | Renn | 427/596 |
| 7,270,844 B2 | 9/2007 | Renn | |
| 7,294,366 B2 | 11/2007 | Renn et al. | |
| 7,485,345 B2 | 2/2009 | Renn et al. | |
| 7,674,671 B2 | 3/2010 | Renn et al. | |
| 2001/0046551 A1 | 11/2001 | Falck et al. | |
| 2002/0012743 A1 | 1/2002 | Sampath et al. | |
| 2002/0100416 A1 | 8/2002 | Sun et al. | |
| 2002/0132051 A1 | 9/2002 | Choy | |
| 2002/0162974 A1 | 11/2002 | Orsini et al. | |
| 2003/0003241 A1 | 1/2003 | Suzuki et al. | |
| 2003/0048314 A1 | 3/2003 | Renn | |
| 2003/0108511 A1 | 6/2003 | Sawhney | |
| 2003/0117691 A1 * | 6/2003 | Bi et al. | 359/333 |
| 2003/0138967 A1 | 7/2003 | Hall et al. | |
| 2003/0175411 A1 | 9/2003 | Kodas et al. | |
| 2003/0180451 A1 | 9/2003 | Kodas et al. | |
| 2003/0202043 A1 | 10/2003 | Moffat et al. | |
| 2003/0219923 A1 | 11/2003 | Nathan et al. | |
| 2003/0228124 A1 | 12/2003 | Renn et al. | |
| 2004/0151978 A1 | 8/2004 | Huang | |
| 2004/0179808 A1 | 9/2004 | Renn | |
| 2004/0197493 A1 | 10/2004 | Renn et al. | |
| 2004/0247782 A1 | 12/2004 | Hampden-Smith et al. | |
| 2005/0002818 A1 | 1/2005 | Ichikawa | |
| 2005/0147749 A1 | 7/2005 | Liu et al. | |
| 2006/0008590 A1 | 1/2006 | King et al. | |
| 2006/0057014 A1 | 3/2006 | Oda et al. | |
| 2006/0163570 A1 | 7/2006 | Renn et al. | |
| 2006/0172073 A1 | 8/2006 | Groza et al. | |
| 2006/0175431 A1 | 8/2006 | Renn et al. | |

FOREIGN PATENT DOCUMENTS

| | | |
|---|---|---|
| EP | 0 444 550 A2 | 9/1991 |
| EP | 0470911 | 7/1994 |
| KR | 10-2007-0008614 | 1/2007 |
| KR | 10-2007-0008621 | 1/2007 |
| WO | WO-01/83101 A1 | 11/2001 |

OTHER PUBLICATIONS

Rao, N. P. et al., "Aerodynamic Focusing of Particles in Viscous Jets", *J. Aerosol Sci.* vol. 24, No. 7, Pergamon Press, Ltd., Great Britain 1993, 879-892.

Zhang, Xuefeng et al., "A Numerical Characterization of Particle Beam Collimation by an Aerodynamic Lens-Nozzle System: Part I. An Individual Lens or Nozzle", *Aerosol Science and Technology* vol. 36, Taylor and Francis 2002, 617-631.

Ashkin, A., "Acceleration and Trapping of Particles by Radiation Pressure", *Physical Review Letters*, (Jan. 26, 1970),156-159.

Ashkin, A., "Optical trapping and manipulation of single cells using infrared laser beams", *Nature*, (Dec. 1987),769-771.

Dykhuizen, R. C., "Impact of High Velocity Cold Spray Particles", (May 13, 2000),1-18.

Lewandowski, H. J., et al., "Laser Guiding of Microscopic Particles in Hollow Optical Fibers", *Announcer 27, Summer Meeting—Invited and Contributed Abstracts*, (Jul. 1997),89.

Marple, V. A., et al., "Inertial, Gravitational, Centrifugal, and Thermal Collection Techniques", *Aerosol Measurement: Principles, Techniques and Applications*, (2001),229-260.

Odde, D. J., et al., "Laser-Based Guidance of Cells Through Hollow Optical Fibers", *The American Society for Cell Biology Thirty-Seventh Annual Meeting*, (Dec. 17, 1997).

Odde, D. J., et al., "Laser-guided direct writing for applications in biotechnology", *Trends in Biotechnology*, (Oct. 1999),385-389.

Renn, M. J., et al., "Evanescent-wave guiding of atoms in hollow optical fibers", *Physical Review A*, (Feb. 1996),R648-R651.

Renn, M. J., et al., "Laser-Guidance and Trapping of Mesoscale Particles in Hollow-Core Optical Fibers", *Physical Review Letters*, (Feb. 15, 1999),1574-1577.

Renn, M. J., et al., "Laser-Guided Atoms in Hollow-Core Optical Fibers", *Physical Review Letters*, (Oct. 30, 1995),3253-3256.

Renn, M. J., et al., "Optical-dipole-force fiber guiding and heating of atoms", *Physical Review A*, (May 1997),3684-3696.

Renn, M. J., et al., "Particle manipulation and surface patterning by laser guidance", *Journal of Vacuum Science & Technology B*. (Nov./Dec. 1998),3859-3863.

Renn, M. J., et al., "Particle Manipulation and Surface Patterning by Laser Guidance", *Submitted to EIPBN '98, Session AM4*, (1998).

Sobeck, et al., *Technical Digest: 1994 Solid-State Sensor and Actuator Workshop*, (1994),647.

TSI Incorporated, "How A Virtual Impactor Works", www.tsi.com.

Vanheusden, K., et al., "Direct Printing of Interconnect Materials for Organic Electronics", *IMAPS ATW, Printing an Intelligent Future*, (Mar. 8-10, 2002),1-5.

King, Bruce, et al, "M3D TM Technology: Maskless Mesoscale TM Materials Deposition", *Optomec pamphlet*, (2001).

Miller, Doyle, et al., "Maskless Mesoscale Materials Deposition", *HDI*, vol. 4, No. 9, (Sep. 2001),1-3.

Renn, Michael J., et al., "Flow- and Laser-Guided Direct Write of Electronic and Biological Components", *Direct-Write Technologies for Rapid Prototyping Applications*, Academic Press,(2002),475-492.

*Webster's Ninth New Collegiate Dictionary*, Merriam-Webster, Inc., Springifled, MA. USA,(1990),744.

* cited by examiner

ANNULAR AEROSOL JET DEPOSITION USING AN EXTENDED NOZZLE

CROSS-REFERENCE TO RELATED APPLICATIONS

This application is a continuation-in-part application of U.S. patent application Ser. No. 10/952,108, entitled "Laser Processing for Heat-Sensitive Mesoscale Deposition", filed on Sep. 27, 2004, which claims the benefit of the filing of U.S. Provisional Patent Application Ser. No. 60/506,495, entitled "Laser Treatment Process for Low-Temperature Deposition", filed on Sep. 26, 2003 and U.S. Provisional Patent Application Ser. No. 60/508,759, entitled "Method for Fabricating Resistive Structures", filed on Oct. 3, 2003, and which is also a continuation-in-part application of U.S. patent application Ser. No. 10/746,646, entitled "Apparatuses, Methods, and Precision Spray Processes for Direct Write and Maskless Mesoscale Material Deposition", filed on Dec. 23, 2003, which is both a continuation-in-part application of U.S. patent application Ser. No. 09/844,666, entitled "Precision Spray Processes for Direct Write Electronic Components", filed on Apr. 27, 2001 (which is a divisional application of U.S. patent application Ser. No. 09/305,985, entitled "Precision Spray Processes for Direct Write Electronic Components", filed May 5, 1999, now issued as U.S. Pat. No. 6,251, 488), and is also a continuation-in-part application of U.S. patent application Ser. No. 10/346,935, entitled "Apparatuses and Method for Maskless Mesoscale Material Deposition", to Michael J. Renn et al., filed on Jan. 17, 2003, which is a continuation-in-part application of the following U.S. Patent Applications:

U.S. patent application Ser. No. 09/574,955, entitled "Laser-Guided Manipulation of Non-Atomic Particles", to Michael J. Renn, et al., filed on May 19, 2000, which was a continuation application of U.S. patent application Ser. No. 09/408,621, entitled "Laser-Guided Manipulation of Non-Atomic Particles", to Michael J. Renn, et al., filed on Sep. 30, 1999, which claimed the benefit of U.S. Provisional Patent Application Ser. No. 60/102,418, entitled "Direct-Writing of Materials by Laser Guidance", to Michael J. Renn, et al., filed on Sep. 30, 1998;

U.S. patent application Ser. No. 09/584,997, entitled "Particle Guidance System", to Michael J. Renn, filed on Jun. 1, 2000, now issued as U.S. Pat. No. 6,636,676, which was a continuation-in-part application of U.S. patent application Ser. No. 09/408,621;

U.S. patent application Ser. No. 10/060,960, entitled "Direct Write™ System", to Michael J. Renn, filed on Jan. 30, 2002, which was a continuation-in-part application of U.S. patent application Ser. Nos. 09/408,621 and 09/584,997; and U.S. patent application Ser. No. 10/072,605, entitled "Direct Write™ System", to Michael J. Renn, filed on Feb. 5, 2002, which was a continuation-in-part application of U.S. patent application Ser. No. 10/060,090.

The specifications and claims of all of the above references are hereby incorporated herein by reference.

FEDERALLY SPONSORED RESEARCH OR DEVELOPMENT

The U.S. Government has a paid-up license in this invention and the right in limited circumstances to require the patent owner to license others on reasonable terms as provided for by the terms of Contract No. N00014-99-C-0243 awarded by the U.S. Department of Defense.

BACKGROUND OF THE INVENTION

1. Field of the Invention (Technical Field)

The present invention relates generally to the field of direct write deposition.

2. Background Art

Note that the following discussion refers to a number of publications and references. Discussion of such publications herein is given for more complete background of the scientific principles and is not to be construed as an admission that such publications are prior art for patentability determination purposes.

Various techniques may be used for deposition of electronic materials, however thick film and thin film processing are the two dominant methods used to pattern microelectronic circuits. Recently, ink jetting of conductive polymers has also been used for microelectronic patterning applications. Thick film and thin film processes for deposition of electronic structures are well-developed, but have limitations due to high processing temperatures or the need for expensive masks and vacuum chambers. Ink jetted conductive polymers have resistivities that are approximately six orders of magnitude higher than bulk metals. Thus, the high resistivity of ink jetted conductive polymers places limitations on microelectronic applications.

U.S. Pat. No. 4,485,387 discloses direct write of electronic circuits onto ceramic targets using an apparatus that feeds a high-viscosity ink through the orifice of a writing pen. One jetting technique, disclosed in U.S. Pat. Nos. 5,772,106 and 6,015,083, dispenses low-melting temperature solder using a process similar to the process used in piezoelectric ink jetting. The minimum feature size attainable with this method was reported to be approximately 70-100 microns. Deposition of metals onto low-temperature targets is not disclosed. U.S. Pat. Nos. 4,019,188, 4,825,229, 5,032,850 and 5,814,152 describe methods for direct deposition of thin films from droplets, particles, or vapors entrained in a carrier gas. U.S. Pat. Nos. 4,825,229 and 5,032,850 disclose a printing method wherein a sublimable dye is mixed with a carrier gas and jetted through an orifice for the purpose of printing color characters or images. The process disclosed in U.S. Pat. No. 5,814,152 requires laser melting and ablation of aerosolized material, and is not capable of localized deposition. U.S. Pat. No. 4,019,188, by Hochberg et al. discloses an aerosol jet apparatus for ink printing applications. The apparatus uses ultrasonic atomization and a pressurized chamber ending in an orifice, to form a jet of aerosolized ink entrained in a carrier gas. Hochberg discloses the use of relatively large exit orifices—the reported orifice diameters range from 200 to 825 microns—and a minimum deposited feature size of 50 microns. The invention of Hochberg does not use a sheath gas to form an annular flow for the purpose of focusing the aerosol stream and preventing accumulation of material at the exit orifice, is limited to the deposition of ink onto paper, and does not disclose a process for aerosolization and deposition of viscous inks or inks composed of particle suspensions.

The Maskless Mesoscale Material Deposition ($M^3D$™) apparatus, on the other hand, provides a method for the direct write of fine features of electronic and biological materials onto low-temperature or high-temperature targets. The $M^3D$™ deposition flowhead uses a series of nested channels that produce an annular aerodynamic focusing of an aerosol-laden carrier gas stream. The as-deposited line features may be as small as approximately 5 microns, and may be treated thermally or using laser radiation. The M³D™ process deposits liquid molecular precursors or precursors with particle inclusions, and uses a subsequent processing step that converts the deposit to the desired state. The precursor viscosity may range from approximately 1 to 1000 centiPoises (cP), as opposed to ink jetted solutions, which are typically confined to around 10 cP. The M³D™ process may also deposit aerosolized materials onto many targets with damage thresholds as low as 100° C., and is a maskless process that can be performed under ambient or inert environmental conditions.

The use of detachable nozzles for material deposition in microelectronic and fluid dispensing applications has been reported. One of the most common microelectronic applications of detachable nozzles is that of wire bonding. U.S. Pat. No. 4,886,200 discloses a capillary tip for bonding a metal wire to a target. The metal wire is passed through the capillary, and ultrasonic vibrations are applied to the metal to bond the wire to the surface of the target. U.S. Pat. No. 6,325,269 discloses a wire bonding capillary that decreases the extraction resistance of the wire during the bonding process using a funnel-shaped bore and a tapered section at the capillary exit. U.S. Pat. No. 6,309,891 discloses an invention for printing small volumes of liquid samples using spring-loaded plungers and a wire bonding capillary in fluid contact with reservoirs containing the liquid to be deposited.

SUMMARY OF THE INVENTION (DISCLOSURE OF THE INVENTION)

The present invention is an apparatus for depositing a material on a target, the apparatus comprising a device for aerosolizing the material, a deposition flowhead with an input connected to the aerosol source, the flowhead combining the aerosolized material with an annular sheath gas flow, and an extended nozzle attached to the output of the deposition flowhead. An annular gas flow, preferably comprising an outer sheath flow and an aerosol-laden inner flow, is preferably developed within the deposition flowhead and passed through the nozzle. The nozzle preferably increases the working distance so that the target is preferably at least several millimeters from the nozzle. The material is preferably depositable into recessed features of the target.

The nozzle is preferably detachable from the flowhead, and is preferably reattachable to the flowhead without requiring realignment. The nozzle is preferably interchangeable with a second nozzle comprising a different exit orifice diameter, or alternatively comprises a variable exit orifice diameter. The nozzle preferably comprises a material selected from the group consisting of alumina, ceramic, metal, tungsten carbide, and ceramet. The nozzle is preferably tapered, preferably comprising an aspect ratio of between approximately 4:1 and approximately 10:1. The nozzle preferably comprises a length between approximately 0.95 centimeters and approximately 1.9 centimeters, and preferably comprises an exit orifice diameter between approximately 50 microns and approximately 500 microns. The exit orifice diameter is more preferably either 150 microns or 100 microns. The linewidth of deposited material preferably comprises a size between approximately one-twentieth and approximately one diameter of an exit orifice of the nozzle.

The invention is also a method for depositing a material on a target, the method comprising the steps of aerosolizing the material, combining a flow stream of the aerosolized material with an annular sheath gas flow, passing the combined material flow stream and sheath gas flow through an extended nozzle, focusing the material flow stream to a size less than or equal to a diameter of an exit orifice of the nozzle, and depositing the material on the target. The method preferably further comprises the step of collimating the material flow stream for approximately 3 to approximately 5 millimeters beyond the exit orifice.

An object of the present invention is to provide direct deposition of features with linewidths varying from a few microns to a fraction of a millimeter, and, with subsequent processing, features with linewidths as low as 1 micron, with sub-micron edge definition.

Another object of the extended nozzle of the present invention is to provide an interchangeable nozzle, enabling rapid variance of deposited linewidth using the same apparatus.

Yet another object of the present invention is to deposit features on targets with damage thresholds near 100° C. or less, optionally under ambient conditions.

A further object of the extended nozzle of the present invention is to provide enhanced deposition characteristics, including but not limited to improved collimation of the jetted aerosol stream, improved focusing and reduced turbulence of the stream, and minimized particle overspray.

An advantage of the extended nozzle of the present invention is an increased working distance, enabling direct write onto non-planar surfaces, allowing processing and diagnostic equipment to be placed closer to the deposition area, reducing the heat transfer from the platen to the deposition module, and facilitating delivery of material into recessed features.

Another advantage of the extended nozzle of the present invention is that it is preferably detachable, enabling easy cleaning and clearing of clogs.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several embodiments of the present invention and, together with the description, serve to explain the principles of the invention. The drawings are only for the purpose of illustrating a preferred embodiment of the invention and are not to be construed as limiting the invention. In the drawings.

Figure 1:
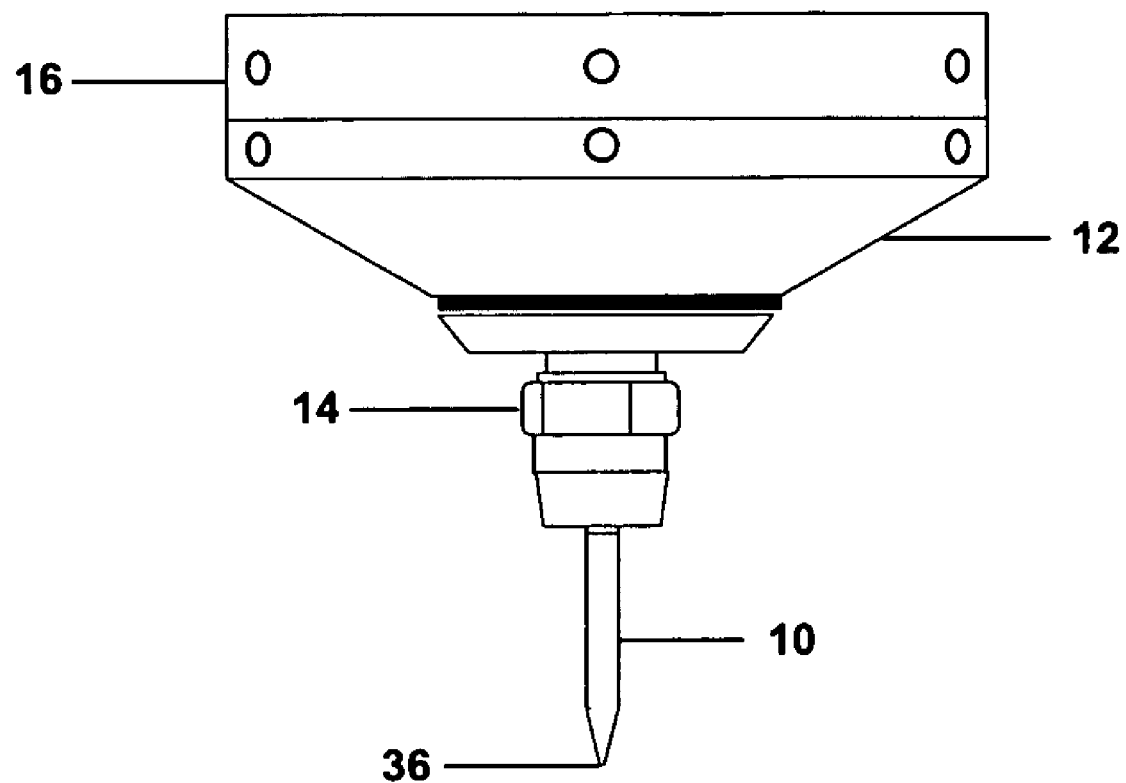
FIG. 1 is a schematic drawing of the M³D™ flow head with an attached extended nozzle of the present invention.

DESCRIPTION OF THE PREFERRED EMBODIMENTS (BEST MODES FOR CARRYING OUT THE INVENTION)

The present invention relates to maskless, non-contact printing of electronic and biological materials onto planar or non-planar surfaces, and more specifically to apparatuses and methods for high-resolution, maskless deposition of liquid and particle suspensions using aerodynamic focusing. In the most commonly used embodiment, an aerosol stream is focused and deposited onto a planar or non-planar target, forming a pattern that is thermally or photochemically processed to achieve physical and/or electrical properties near that of the corresponding bulk material. The process is termed $M^3D^{TM}$, Maskless Mesoscale Material Deposition, and is used to deposit aerosolized materials with linewidths that are an order of magnitude smaller than lines deposited with conventional thick film processes. The process and apparatus are more fully described in U.S. Patent Application Publication No. 2003/0228124, incorporated herein by reference. Deposition is performed without the use of masks. The term mesoscale refers to sizes from approximately 1 micron to 1 millimeter, and covers the range between geometries deposited with conventional thin film and thick film processes. Furthermore, with post-processing laser treatment, the $M^3D^{TM}$ process is capable of defining lines having widths as small as 1 micron. Applications of the $M^3D^{TM}$ process include, but are not limited to, direct write of circuits and devices for electronic applications, as well as the direct write of materials for biological applications.

The $M^3D^{TM}$ system is an apparatus preferably comprising an atomization module for aerosolizing liquids and particle suspensions, a deposition module comprising a flowhead for directing and focusing the resulting aerosol stream, a control module for automated control of process parameters, a laser delivery module that delivers laser light through discreet optical elements or through an optical fiber, and a motion control module that drives a set of X-Y translation stages. The laser module adds the additional capability of curing materials, even on low temperature targets. The deposition module can be integrated into pre-existing control, motion, and laser delivery modules.

The $M^3D^{TM}$ control module provides automated control of process parameters and process monitoring. The process parameters include but are not limited to the aerosol carrier gas and sheath gas flow rates, the aerosol preheat temperature, and the target temperature. The control module may be operated as a stand-alone unit via manual input on the module's front panel, or remotely operated via communication with a host computer. Remote operation via a host computer is preferable for coordinating the deposition module with the other components of the $M^3D^{TM}$ system.

A target is preferably attached to a computer-controlled platen that rests on the X-Y linear translation stages. Patterning is created by translating the flowhead under computer control while maintaining a fixed target position, or by translating the target while maintaining a fixed flowhead position, or both. The process also allows for the deposition of three-dimensional structures. These properties enable the deposit of structures with intricate geometries. This motion is preferably controlled by the motion control module, which preferably consists of a motion control card, an I/O interface, the X-Y linear stages for moving either the target or the deposition flowhead, a z-axis for positioning the deposition flowhead above the target, and amplifiers for driving the stages. The I/O interface, amplifiers, and associated power supplies are preferably housed in an external, rack mountable enclosure. The motion control card typically is installed in a host computer and is connected to the I/O interface via an appropriate cable. The I/O interface preferably comprises analog outputs to the drive amplifiers and discrete outputs for actuating the material and laser shutters. Control of the amplifiers and shutters is preferably handled by the motion control module, so that the timing of shuttering events is coordinated with target motion.

A series of heaters mounted in the platen is preferably used to control the temperature of the target. The target may be heated from room temperature preferably to approximately 200° C. to drive off solvent, or to improve the deposition characteristics of the aerosolized material that exits the nozzle. In some cases, it may be advantageous to cool the target. If target cooling is necessary, a thermoelectric cooler or chilled water loop, passed through the platen, can be used to reduce the target temperature.

The present invention is an extended tip or nozzle attached to the deposition head of a materials deposition system such as the $M^3D^{TM}$ system which is used to improve the flow and deposition characteristics of an annularly-flowing aerosol jet apparatus, enabling deposition of well-defined features with linewidths below 10 microns. Deposition and subsequent processing may be performed under ambient conditions and produce linewidths as low as 1 micron, with sub-micron edge definition. The invention may be used to print electronic and biological materials onto temperature-dependent materials, and can be performed without the use of an inert atmosphere. Enhanced deposition characteristics include improved collimation of the jetted aerosol stream, improved focusing of the stream, minimized particle overspray, and facilitated delivery of material into recessed features.

The nozzle preferably reduces the diameter of the emergent stream and collimates the stream to a fraction of the nozzle orifice diameter, preferably at distances of approximately 3 to 5 millimeters beyond the nozzle exit orifice. The extended nozzle increases the working distance; that is, the distance from the flowhead to the target. When using the nozzle, the orifice-to-target distance may be several millimeters or more, enabling direct write onto non-planar surfaces. This also enables processing and diagnostic equipment to be placed closer to the deposition area and reduces the heat transfer from the platen to the deposition module. Further, this geometry allows for improved deposition of material into recessed features.

The extended nozzle of the present invention is preferably detachable, which serves a number of purposes. First, it facilitates cleaning of the aerosol jet device. Cleaning is necessary when a fluctuating mass flux of deposited material, divergent flow, or clogging of the system occurs. Inconsistent deposition or clogging may be due to material buildup in the system, which eventually causes failure of the jet. Such buildup typically occurs in the deposition head, or in the nozzle channel or orifice. A detachable nozzle can be removed from the deposition system, cleaned, and replaced, without realigning the system, for example to target fiducials. A detachable nozzle also facilitates replacement of broken nozzles, without realignment.

A detachable nozzle also means that interchangeable nozzles may be used. The exit orifice may have a diameter ranging from approximately 50 to 500 microns. The deposited linewidth can be approximately from as small as one-twentieth the size of the orifice diameter up to the size of the orifice diameter. Thus, the size of the orifice diameter used in the deposition process is determined by the desired range of deposited linewidths. Therefore, the use of interchangeable detachable extended nozzles enables the size of deposited structures to be rapidly varied from as small as a few microns to as large as a fraction of a millimeter, using the same deposition apparatus. As an alternative to exchanging the nozzle, a nozzle with a variable orifice diameter may optionally be used.

The extended tip of the present invention preferably comprises a ceramic, including but not limited to alumina (aluminum oxide). The tip may optionally be metallic or comprise a ceramet (including but not limited to a composite of tungsten and ceramic, for example tungsten carbide).

The nozzle is also preferably tapered; the taper depends on length and orifice size. The tip of the present invention is preferably approximately 0.95 to 1.9 centimeters long, with an exit orifice diameter preferably ranging from approximately 50 to 500 microns. Generally the aspect ratio, or the ratio of input orifice diameter to output orifice diameter, ranges from preferably approximately 4:1 to 10:1. A 100 micron orifice tip tapers from 1000 to 100 microns for an aspect ratio of 10:1, while a 150 micron orifice tip tapers from approximately 720 to 150 microns, for an aspect ratio of 4.8. However, depending on the application, various aspect ratios or tapers may be used with any given length and/or orifice size.

Figure 2:
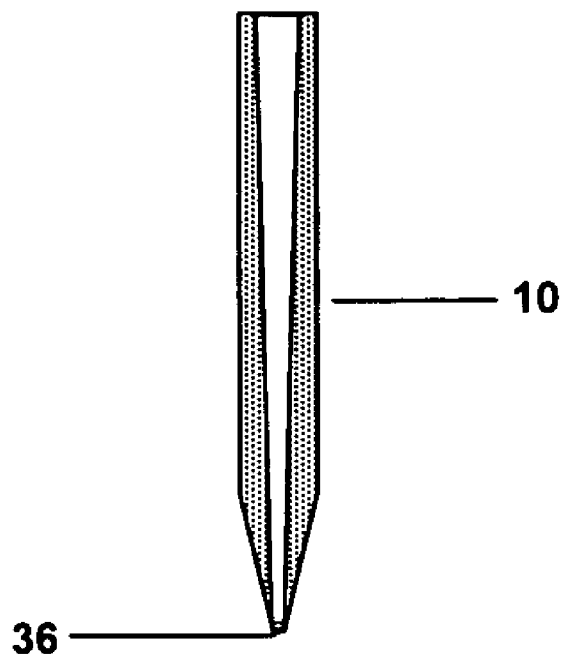
FIG. 2 is a cross section view of the extended nozzle of the present invention.
Figure 3:
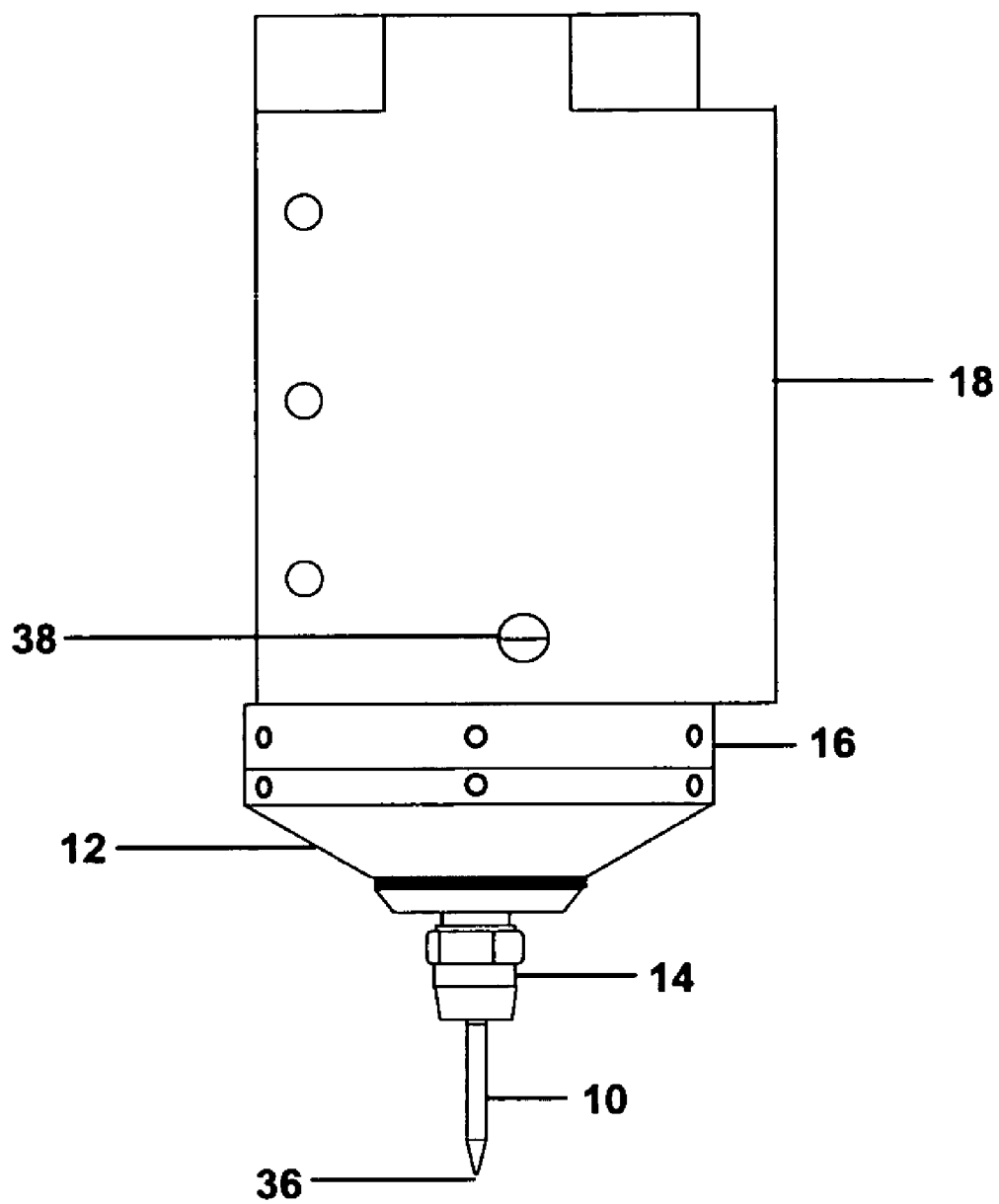
FIG. 3 is a schematic side view of the M³D™ flowhead, with an optional heater assembly.

FIGS. 1 and 2 depict a preferred embodiment of the extended nozzle of the present invention. The deposition flowhead preferably comprises upper chamber 16 and lower chamber 12. Extended nozzle 10, which comprises exit orifice 36, is preferably attached to lower chamber 12, preferably via pneumatic fittings and tightening nut 14. The aerosol stream is focused by the M³D™ flowhead, a schematic cross-section of which is shown in FIG. 3. The M³D™ flowhead focuses an aerosol stream preferably by forming an annular flow between the aerosol stream and a sheath gas stream. The sheath gas enters the flowhead via sheath gas inlet 38 preferably located in optional heater assembly 18, which is more fully described below, and which is preferably attached to upper chamber 16 of the flowhead. The annular flow exits the flowhead and enters extended nozzle 10, with an exit orifice 36 directed at the target. The M³D™ flowhead is capable of focusing an aerosol stream on a target to as small as approximately one-twentieth the size of exit orifice 36. The aerosolized fluid used in the M³D™ process preferably comprises a liquid source material including but not limited to liquid molecular precursors for a particular material, particulate suspensions, some combination of precursor and particulates, and biological materials and biomaterials suspended or dissolved in a fluid.

Figure 4:
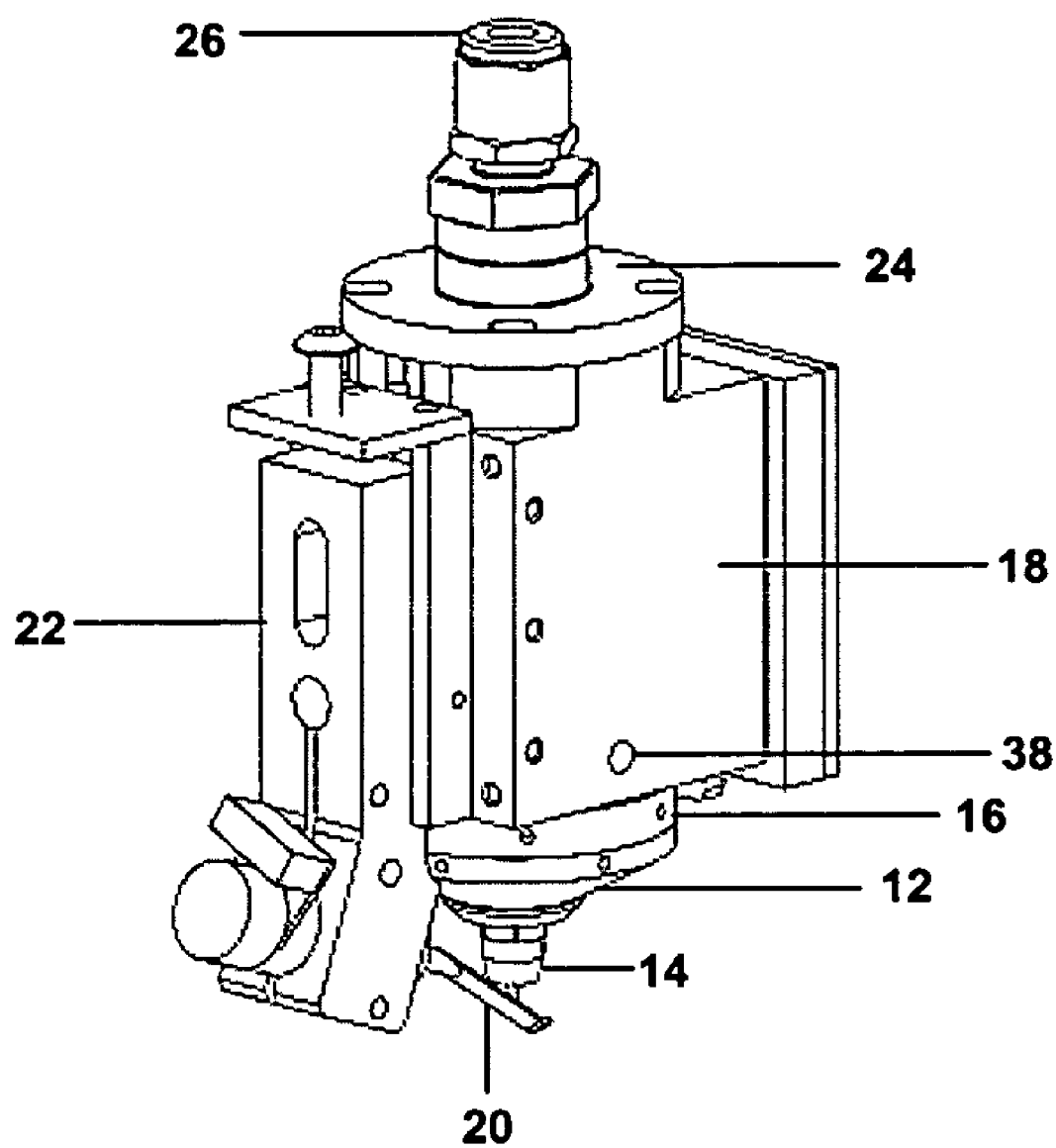
FIG. 4 is a perspective drawing of the M³D™ apparatus configured for ultrasonic atomization.
Figure 5:
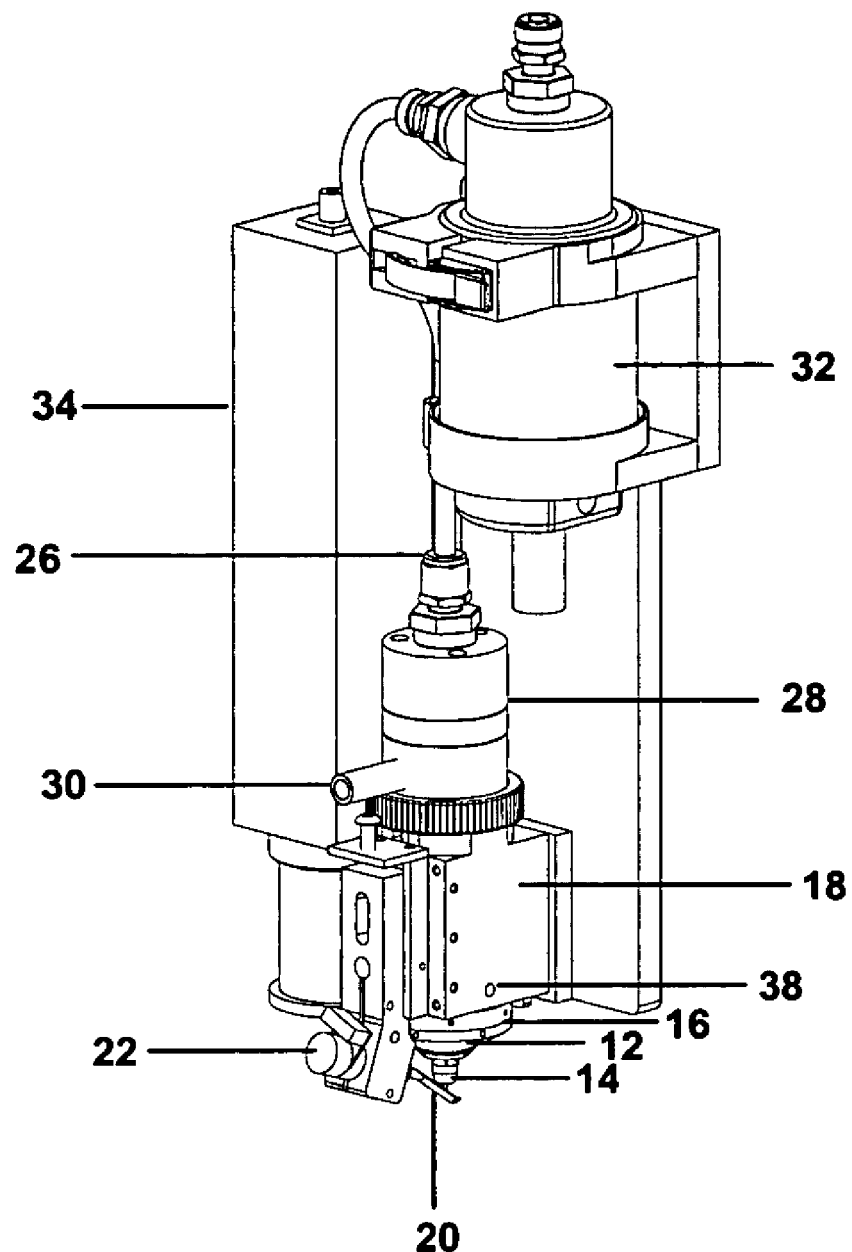
FIG. 5 is a perspective drawing of the M³D™ apparatus configured for pneumatic atomization.

FIGS. 3-5 depict apparatuses for performing the M³D™ process, which preferably begins with the aerosolization of a solution of a liquid molecular precursor or suspension of particles. The solution may alternatively be, for example, a combination of a liquid molecular precursor and particles. Precursor solutions are preferably atomized using an ultrasonic transducer or pneumatic nebulizer. These two aerosolization methods allow for generation of droplets or droplet/particles with sizes typically ranging from approximately 1 to 5 microns, although other sizes are achievable. The fluid properties, as well as the final material and electrical properties of the deposit, are typically dependent on the precursor chemistry.

FIG. 4 shows the M³D™ lower module configured for ultrasonic atomization. Ultrasonic aerosolization is typically only applicable to solutions with viscosities of approximately 1-10 cP, which typically comprise particle suspensions consisting of either small or low-density particles. In this case, the solid particles may be suspended in water or an organic solvent and additives that maintain the suspension. In the flow guidance (or annular aerosol jetting) process, the atomized aerosol stream enters the flowhead via aerosol inlet 26, which is attached to the flowhead by adapter 24. The aerosol stream then enters upper chamber 16 of the flowhead after passing through optional heater assembly 18. The mass throughput is preferably controlled by an aerosol carrier gas mass flow controller. Inside the flowhead, the aerosol stream is initially collimated preferably by passing through a millimeter-size orifice. The emergent particle stream is then preferably surrounded with an annular sheath gas. The sheath gas preferably comprises compressed air or an inert gas, and may contain a modified solvent vapor content. The sheath gas enters through at least one sheath gas inlet 38 below aerosol inlet 26 and forms an annular flow with the aerosol stream. As with the aerosol carrier gas, the sheath gas flow rate is preferably controlled by a mass flow controller. The combined streams exit the flowhead via extended nozzle 10 through exit orifice 36 and are directed at a target. Material shutter 20 is preferably placed between nozzle 10 and the target in order to achieve patterning of the deposited material by selectively interrupting the flow of material. Material shutter 20 is preferably computer-controlled. Shutter assembly 22 is preferably attached to heater assembly 18.

This annular flow of the sheath gas collimates and focuses the aerosol stream onto the target and allows for deposition of features with dimensions as small as approximately 5 microns. The sheath preferably forms a boundary layer that prevents the aerosol particles from depositing onto the orifice wall. This shielding effect minimizes, or in the optimum case, completely eliminates clogging of the nozzle orifices. The diameter of the emerging stream (and therefore the linewidth of the deposit) is controlled by the size of exit orifice 36, the ratio of sheath gas flow rate to carrier gas flow rate, and the distance between orifice 36 and the target. Deposited structures may be as small as approximately one-twentieth the size of the orifice diameter. The largest structures deposited using extended nozzle 10 in a single pass of the deposition head may have linewidths approximately as large as the diameter of exit orifice 36. Orifice diameters are preferably 150 and 100 microns, although any diameter may be chosen. The 150-micron orifice is capable of depositing material with a minimum linewidth of approximately 10 microns, with a flow ratio (the ratio of the sheath gas flow rate to the carrier gas flow rate) of approximately 5.0. The 100-micron orifice can deposit features with a minimum linewidth of approximately 5 microns, with a flow ratio of approximately 1.0 to 2.0.

FIG. 5 shows the M³D™ apparatus configured for pneumatic atomization. In general, fluids with viscosities from approximately 1 to 1000 cP may be atomized pneumatically. The pneumatic atomization process, which preferably uses pneumatic nebulizer 32, typically requires a higher carrier gas flow rate than the flowhead can accept. When using pneumatic atomization, therefore, virtual impactor 28 is preferably used to reduce the flow rate of the carrier gas, without appreciable loss of particle mass flow. The number of stages used in virtual impactor 28 may vary depending on the amount of carrier gas that must be removed. In the event that a single stage of virtual impaction is insufficient to remove enough excess carrier gas, multiple stages of impaction may be employed. The use of multiple virtual impaction stages allows for increased densification of the aerosol stream as the flow passes through each stage.

A single stage virtual impactor preferably comprises a nozzle, a large chamber with exhaust port 30, and a collection probe. The nozzle and collection probe are preferably opposed to each other along the axis of the chamber. A particulate laden gas stream referred to as the total flow $Q_o$ is accelerated through the nozzle into the chamber. When the particle-laden jet flows into the chamber and through the gap between the nozzle and the collection probe, only the inner portion of the total flow passes through the gap and into the collection probe. The outer portion of the flow, along with small particles, flows around the collection probe. This flow is referred to as the major flow, and is exhausted from the system. The flow that remains in the collection probe is referred to as the minor flow, and is directed downstream for further processing. Particles having sufficient momentum will continue to be entrained by the minor flow, and will follow a forward trajectory through the collection probe. Particles with insufficient momentum will be exhausted with the major flow. The momentum of the particles is determined by the particle size and density, the kinematic properties of the gas, and the jet velocity. The particle size at which particles have just enough momentum to enter the collection probe is referred to as the cut-point of the impactor. Generally, in the present invention, the particles entrained in the gas stream are approximately 1-5 microns in diameter, although particles smaller than 1 micron and as large as 50 microns or more may be used. Particles larger than the cut-point enter the collection probe and are directed into devices downstream of the impactor. Particles smaller than the cut-point remain in the stripped excess gas and are exhausted from the system, optionally to the atmosphere through exhaust port 30. The exhaust may optionally be filtered to avoid damaging flow control devices or to collect particles for reuse.

In order for virtual impactor 28 to function properly, the exhaust gas must be removed from the chamber at a specific flow rate. This may be accomplished by feeding the exhaust gas through a flow control device such as a mass flow controller. A vacuum pump may optionally be used if ambient conditions do not provide a sufficient pressure drop to achieve the flow rates required for proper operation of the virtual impactor. The efficiency of virtual impactor 28 is determined by the amount of aerosol that remains in the minor flow, or by the amount of aerosol that is physically impacted onto the collection probe. Close geometrical control of the impactor can improve the efficiency, as can control of the aerosol particle size distribution. By shifting the mean of the particle size distribution above the cut-point of the impactor, the number of particles that remain in the stream can be maximized, thereby minimizing both waste and clogging. An additional impactor stage may optionally be used to strip off particles below a certain size range, so that only particles above a certain size are presented to the downstream devices. Since the deposition is a physical impaction process, it may be advantageous to present only droplets of a certain size to the target. For example, resolution may be improved by depositing only 5 micron sized droplets. Another example where it may be advantageous to deposit only certain sized droplets is via filling.

The mist produced in the aerosolization process is delivered to a deposition flowhead preferably using a carrier gas. The carrier gas is most commonly compressed air or an inert gas, where one or both may contain a modified solvent or suspending medium vapor content. The carrier gas flow rate is preferably controlled by a mass flow controller. The aerosol may be modified while transiting through optional heater assembly 18, which is preferably used to evaporate the precursor solvent and additives or the particle-suspending medium. This evaporation allows for the modification of the fluid properties of the aerosol for optimum deposition. Partial evaporation of the solvent increases the viscosity of the deposited fluid. This increased viscosity allows for greater control of the lateral spreading of the deposit as it contacts the target. A preheat temperature controller is preferably used to change the temperature of the heater assembly 18. In some cases, the addition of solvent or suspending medium droplets or vapor to the aerosolized mist is necessary to prevent drying of the aerosol stream, that is, to prevent aerosol droplet evaporation, due to the partial or complete evaporation of the solvent or suspending medium in the aerosolized mist before the aerosolized droplets reach the target. This is preferably accomplished by introducing a solvent vapor or suspending medium vapor into the carrier gas flow. Similarly, in some cases it may be advantageous to add aerosolized solvent droplets, solvent vapor, or suspending medium vapor to the sheath gas flow. The introduction of solvent or suspending medium vapor may also be useful in preserving the functionality of biological materials.

As shown in FIG. 5, the M$^3$D™ apparatus preferably comprises laser delivery module 34, which preferably comprises a commercially available laser to process deposits or the in-flight aerosol stream. The laser preferably comprises a continuous wavelength frequency-doubled Nd:YAG laser, however a variety of lasers may be employed so that the deposit, aerosol, or target is absorbing at the laser wavelength. Laser delivery module 34 preferably also comprises a shutter, an acousto-optic modulator, delivery optics, and a focusing head. The laser shutter can be mechanical or optical and is used to rapidly interrupt the delivery of laser radiation to the target in coordination with the motion control system. The acousto-optic modulator is used for rapid dynamic power shuttering control, which may also be coordinated with the relative motion of the target. The delivery optics may comprise either an optical fiber and associated launch optics, or mirrors, lenses, and apertures. Laser delivery module 34 is preferably controlled via communication with the host computer.

Laser treatment, or alternatively thermal treatment, may be used to process deposited materials to the desired state. It is typically desirable for the deposited material to possess physical and/or electrical properties near that of a bulk material. In the case of metal precursors, dense metal lines can be formed with thermal decomposition temperatures as low as 150° C. For precursor-based materials, thermal treatment is preferably used to raise the temperature of the deposit to its decomposition or curing temperature. In these processes, a chemical decomposition or crosslinking takes place as a result of the input of thermal energy, such that the precursor changes its molecular state, resulting in formation the desired material plus some effluents. Preferably the deposit is subsequently cured by applying heat until the effluents are driven off and polymerization takes place. One example of a chemical decomposition of a molecular precursor to a metal is that of the reaction of silver nitrate, a metal salt, to form silver plus nitrogen, oxygen, and nitrogen/oxygen compounds.

Chemical decomposition has also been accomplished using laser radiation as the heat source. In this case, the precursor or precursor/particle combination is preferably formulated so that the fluid is absorbing at the laser wavelength. The high absorption coefficient at the laser wavelength allows for very localized heating of the deposit, which in turn may be used to produce fine deposits (for example, as small as 1 micron for a frequency-doubled Nd:YAG laser) with no damage to the target. The M$^3$D™ process has been used to deposit and laser process silver on FR4, polyimide, polycarbonate, and other plastic and low-temperature targets with damage thresholds below 200° C.

Two specific examples of material deposition are as follows. In the deposition and processing of ceramics and other refractory powders, laser sintering is preferably used to soften low-melting temperature particles used to bind the refractory powder. In this process the laser is scanned over the deposit and absorbed by the glass or the powder, softening the glass so that wetting of the glass to the ceramic or other refractory particles takes place. The laser sintering process also prompts adhesion between particles and the target. In the case of Direct Write Biologics (DWB™), thermal treatment is used to incubate deposited biological samples. The goal of incubation is to produce a desired biochemical reaction, such as the development of enzyme activity.

Although the invention has been described in detail with particular reference to these preferred embodiments, other embodiments can achieve the same results. Variations and modifications of the present invention will be obvious to those skilled in the art and it is intended to cover all such modifications and equivalents. The entire disclosures of all patents and publications cited above are hereby incorporated by reference.

What is claimed is:

1. An apparatus for depositing a material on a target, said apparatus comprising:
   a device for aerosolizing the material;
   a deposition flowhead comprising an input connected to said device and an output, said flowhead forming a combined flow comprising an annular sheath gas surrounding and focusing said aerosolized material and outputting said combined flow through said output;
   an extended nozzle attached to said output of said deposition flowhead, said extended nozzle comprising an interior passage for transporting said combined flow which is tapered along substantially the entire length of said extended nozzle; and
   no more than one orifice for narrowing said combined flow sufficiently to form a deposited feature comprising a feature size of less than one millimeter on the target;
   wherein said extended nozzle is of sufficient length to reduce a diameter of said combined flow to less than a diameter of said orifice beyond said orifice.

2. The apparatus of claim 1 wherein an annular gas flow is developed within said deposition flowhead and passed through said extended nozzle.

3. The apparatus of claim 2 wherein said annular gas flow comprises an outer sheath flow and an aerosol-laden inner flow.

4. The apparatus of claim 1 wherein said extended nozzle increases the working distance.

5. The apparatus of claim 4 wherein the target is at least several millimeters from said extended nozzle.

6. The apparatus of claim 4 wherein the material is depositable into recessed features of the target.

7. The apparatus of claim 1 wherein said extended nozzle is detachable from said flowhead.

8. The apparatus of claim 7 wherein said extended nozzle is reattachable to said flowhead without requiring realignment.

9. The apparatus of claim 7 wherein said extended nozzle is interchangeable with a second nozzle comprising a different exit orifice diameter.

10. The apparatus of claim 1 wherein said extended nozzle comprises a variable exit orifice diameter.

11. The apparatus of claim 1 wherein said extended nozzle comprises a material selected from the group consisting of alumina, ceramic, metal, tungsten carbide, and ceramet.

12. The apparatus of claim 1 wherein said extended nozzle is tapered.

13. The apparatus of claim 12 wherein said extended nozzle comprises an aspect ratio of between approximately 4:1 and approximately 10:1.

14. The apparatus of claim 1 wherein said extended nozzle comprises a length between approximately 0.95 centimeters and approximately 1.9 centimeters.

15. The apparatus of claim 1 wherein said extended nozzle comprises an exit orifice diameter between approximately 50 microns and approximately 500 microns.

16. The apparatus of claim 15 wherein said exit orifice diameter is 150 microns.

17. The apparatus of claim 15 wherein said exit orifice diameter is 100 microns.

18. The apparatus of claim 1 wherein a linewidth of deposited material comprises a size between approximately one-twentieth and approximately one diameter of an exit orifice of said extended nozzle.

* * * * *